(12) United States Patent
Dhong et al.

(10) Patent No.: US 6,268,660 B1  
(45) Date of Patent: Jul. 31, 2001

(54) SILICON PACKAGING WITH THROUGH WAFER INTERCONNECTS

(75) Inventors: Sang Hoo Dhong; Harm Peter Hofstee; Michael Jay Shapiro, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/263,032

(22) Filed: Mar. 5, 1999

(51) Int. Cl.[7] ................................................. H01L 23/48
(52) U.S. Cl. ............................................... 257/774; 257/738
(58) Field of Search ................................ 257/777, 774, 257/723, 737, 738, 780, 785, 784; 438/597

(56) References Cited

U.S. PATENT DOCUMENTS

| | | |
|---|---|---|
| 3,787,252 | 1/1974 | Filippazzi et al. . |
| 5,024,966 | 6/1991 | Dietrich et al. . |
| 5,039,628 | 8/1991 | Carey . |
| 5,198,888 * | 3/1993 | Sugano et al. ........................ 257/686 |
| 5,391,917 | 2/1995 | Gilmour et al. . |
| 5,506,755 * | 4/1996 | Miyagi et al. ........................ 257/723 |
| 5,608,262 * | 3/1997 | Degani et al. ........................ 257/723 |
| 5,646,828 * | 7/1997 | Degani et al. ........................ 257/738 |
| 5,654,590 * | 8/1997 | Kuramochi ........................... 257/778 |
| 5,656,856 * | 8/1997 | Kweon ................................. 257/686 |
| 5,717,245 * | 2/1998 | Pedder ................................. 257/780 |
| 5,763,947 | 6/1998 | Bartley . |
| 5,854,534 * | 12/1998 | Beilin et al. ......................... 257/691 |
| 5,869,894 * | 2/1999 | Degani et al. ........................ 257/723 |
| 5,910,685 * | 6/1999 | Watanabe et al. .................... 257/777 |
| 5,942,795 * | 8/1999 | Hoang .................................. 257/692 |
| 5,953,213 * | 10/1999 | Napierala ............................. 257/692 |
| 5,990,550 * | 11/1999 | Umezawa ............................ 257/712 |
| 6,002,178 * | 12/1999 | Lin ....................................... 257/778 |
| 6,006,428 * | 12/1999 | Feilchenfeld et al. ............... 257/642 |
| 6,013,948 * | 1/2000 | Akram et al. ........................ 257/698 |
| 6,034,427 * | 3/2000 | Lan et al. ............................. 257/698 |
| 6,046,499 * | 4/2000 | Yano et al. ........................... 257/712 |
| 6,049,465 * | 4/2000 | Blish, II et al. ..................... 257/784 |
| 6,052,287 * | 4/2000 | Palmer et al. ....................... 361/767 |
| 6,064,113 * | 5/2000 | Kirkman .............................. 257/691 |
| 6,081,026 * | 6/2000 | Wang et al. .......................... 257/700 |

* cited by examiner

Primary Examiner—Eddie C. Lee  
Assistant Examiner—Lourdes Cruz  
(74) Attorney, Agent, or Firm—Casimer K. Salys; Bracewell & Patterson, L.L.P.

(57) ABSTRACT

A package for integrated circuit chips. The package contains a silicon substrate having a top surface and a bottom surface. The package also contains a first means for electrically connecting the integrated circuits to the substrate attached to the top surface of the substrate. A multilevel wiring is located at the top surface and is coupled to the first connecting means and serves as a communication link among a plurality of the first connecting means to enable multi-chip processing. A via containing means for coupling the multi-level wiring at the top surface to the bottom surface runs through the substrate from the bottom surface to the top surface. A second means is also present for connecting the coupling means at the bottom surface of the substrate with external components.

16 Claims, 3 Drawing Sheets

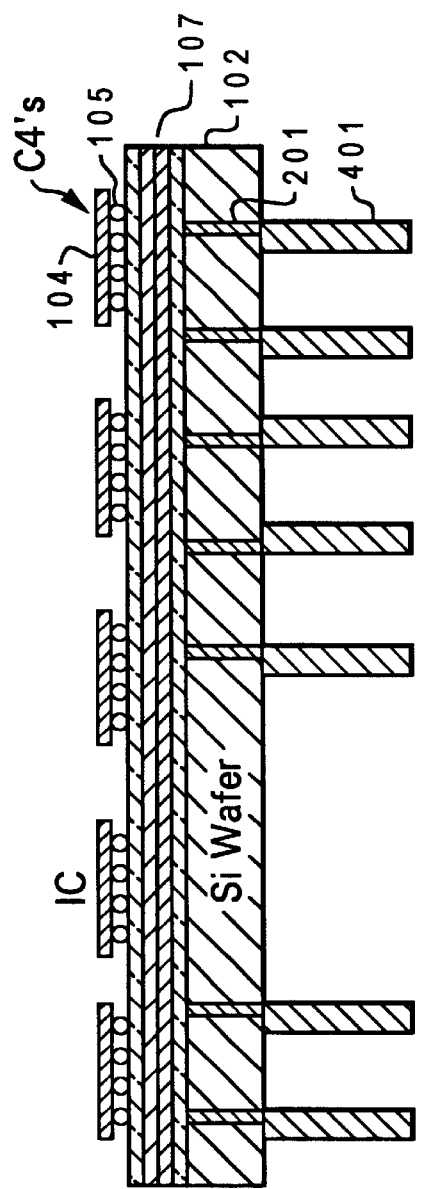
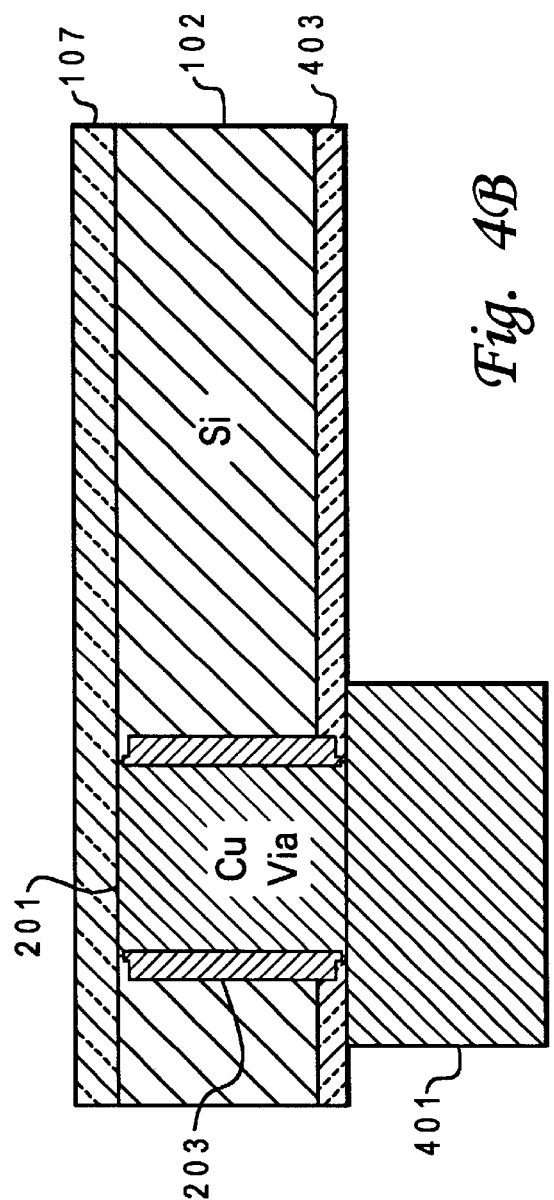

SILICON PACKAGING WITH THROUGH WAFER INTERCONNECTS

RELATED APPLICATIONS

The present invention is related to the subject matter of the following commonly assigned, U.S. patent application Ser. No. 09/263031, now U.S. Pat. No. 6,221,769 entitled "Method For Integrated Circuit Power and Electrical Connections Via Through-Wafer Interconnects" and filed Mar. 5, 1999. The content of the above-referenced application is incorporated herein by reference.

BACKGROUND OF THE INVENTION

1. Technical Field

The present invention relates in general to semiconductor devices and in particular to an improved semiconductor chip package. Still more particularly, the present invention relates to a semiconductor chip package having a silicon substrate with connection vias running through it for attaching and interconnecting to electrical power and other electronic devices.

2. Description of the Related Art

Due to an ever-increasing demand for performance and miniaturization, semiconductor manufacturers are continually driven to produce smaller and more efficient semiconductor devices. In order to reduce the size of semiconductor device packages, manufacturers have developed single and multi-chip modules (SCMs and MCMs) that efficiently house semiconductor chips having a large number of connections. A countervailing consideration in semiconductor device development is a desire to provide additional signal connections, and power connections for large power input to the semiconductor chips (also known as integrated circuit (IC) chips). A larger substrate is often required to accommodate these additional signal and power connections.

Traditionally, integrated circuit chips were placed on a ceramic substrate with connection points through the substrate. The chip pins were run through the substrate to provide connections. These ceramic substrates are easily drilled into a feature which allows connection signal wiring and power leads to be run through the substrate. However, with the increase in the number of chips on an individual substrate and the need for maximum chip density, utilization of ceramic substrate has become impractical. The ceramic substrate becomes rather expensive to manufacture because of the increased wiring required. Additionally, the additional wiring slowed the system down resulting in lower performance. Further, these packages did not perform well under thermal expansion as the substrate expanded at a different level than the silicon chips leading to breakage and other performance considerations.

Current multi-chip circuitry design requires attachment to a substrate of electrical and electronic devices, often times in the form of integrated circuit (IC) chips. The substrate which includes an interconnect wiring structure (or socket) and a support therefor, electrically connects the chips. Presently known attachments involve the attachment of the chips directly to the interconnect, thus forming a multilayer structure of support interconnect chips.

The interconnect surface serves a number of services in addition to chip attachment. For example, the interconnect surface provides for test pads for testing the attached circuitry and underlying wiring, for engineering changes pads for rewiring the circuitry, for termination resistors, for repair to the circuitry and so on. These different functions and their attendant structures compete with chip attachment structures for room on the interconnect. As a result, the chip packing density is less than optimal because space must be left between the chips for these other various structures. As more and more structure is required on the interconnect surface, the chip density declines. Optimally, the chip density should approach 100% in a planar multi-chip module.

Accordingly, there exists a need for a substrate structure which is capable of supporting the many functional requirements as required of such complex semiconductor chip structures while optimizing chip density.

New methods of semiconductor development involves the utilization of a silicon wafer as a substrate. Silicon substrate is cheaper and faster than ceramic substrate. The entire component is manufactured out of silicon and can be completed in the same process. Additionally, improved performance was achieved as the substrate now has the same thermal expansion as the IC chip. Consequently, silicon on silicon packaging has become more common and is quickly replacing multilayer ceramic packages.

The utilization of silicon wafer as substrate material is known in the art, particularly to solve the problem of matching the thermal coefficient of expansion between the substrate and the chips. U.S. Pat. No. 5,039,628 describes a multi-chip module wherein a silicon material can be utilized as a carrier for integrated circuit devices. A preferred carrier material will have a thermal coefficient of expansion to match the mounted chips.

Problems exist however in the utilization of silicon substrate. Unlike the ceramic substrate, silicon substrate is not easily bored. This means that wires can no longer be placed through the substrate. The connections are placed on the top surface of the substrate in a layer called the multilevel wiring. This has led to a new design for the entire semiconductor package with the wire connectors extending along the top of the substrate and off the sides. FIG. 1 depicts the new design being utilized for a typical silicon on silicon chip structure. Integrated circuit chips 103 are placed on silicon substrate 101 in a grid like pattern. At the edge of silicon substrate 101 are a number of metallic pads 109. These metallic pads 109 are utilized to provide off wafer connections to the chip, including power supply and electrical signals and ground. The silicon packages also utilize wire bond pads to receive input/output. Running below IC chip 103 in the top surface of silicon substrate 101 is a multilevel wiring (not shown) for connecting IC chips to provide on wafer processing.

As is obvious from FIG. 1 only the relatively small perimeter area of the substrate can be utilized to provide all the metallic pad connections required for the IC chip circuitry. This configuration limits the number of connection pads available to the IC chips, known in the art as "pad limited." Often this number is insufficient for the need of the IC chips during complex processing which require numerous external connections. Additionally, these connection pads and wiring structure do not allow for large power supplies to be provided to the chips which is oftentimes required. As can be ascertained, this severely hurts chip performance.

For purposes of reliability, the contacts for external connections cannot have very small dimensions and therefore a substantial part of the useful surface is occupied by these contacts. In addition, in the case of integrated circuits, a number of circuit elements must be connected together and to the external circuits. This results in multiple cross overs and super-positions and the connecting conductors which therefore must be mutually insulated by the interposition of dielectric layers. This construction causes an increase of fabrication costs, a reduction of the density of circuit elements which can be located on a single semiconductor wafer and a decrease in the production yield and in the reliability of the integrated circuit.

One method of correcting this limitation is to provide through wafer interconnects to the IC chips. With the connections placed below the wafer, the chip is then ideally able to connect as many leads as can fit on the bottom surface area of the wafer with minimum spacing between. Additionally, these leads can be made large enough to support huge power requirements.

Creating vias through the carrier material is known in the art. U.S. Pat. No. 4,956,695 is a three dimensional chip package wherein plural ICs, having interconnection leads extending therefrom are bonded with dielectric material. Ceramic spacers are placed between the leads and the ends of the spacers are then ground down to expose the interconnection leads. Ceramic spacers are used to match the thermal coefficient of expansion of the chips.

Other conventional systems utilize silicon as a carrier for integrated circuit devices and form vias in the silicon to allow connection through the carrier. For example, U.S. Pat. No. 3,787,252 is a semiconductor wafer having circuit elements formed on an epitaxial layer. Through connections are formed through the wafer to allow the circuit elements to contact interconnection points for conductors disposed on an adjacent insulating board. Although vias are created through the substrate, this patent utilizes these vias to connect an interlevel wiring located below the substrate with the chips at the top surface, resulting in longer chips and decreased efficiency. Further, the prior art does not allow for a large power supply because power connections are first fanned out at the wiring level before being sent through the larger conducting vias up to the chip.

U.S. Pat. No. 5,024,966 discusses a silicon substrate used to mount a semiconductor optical device. An external modulated current source is then interconnected to the optical device. The silicon substrate includes a metallized via to allow connection of the optical device to a conducting layer disposed on the opposite side of the substrate. U.S. Pat. No. 5,063,177 describes packaging of monolithic microwave integrated circuits on a motherboard of high resistivity silicon.

Substantial difficulties, increasing with the degree of miniaturization and the complexity of the circuits, are encountered in all these cases for establishing connection means. These difficulties are mainly caused by the fact that, in the prior art technique, the connection means comprise connecting contacts and conductors located exclusively on the same face of the conductor wafer on which the circuit elements are fabricated.

Prior art methods of creating the connections through the silicon have in large part been unsuccessful and/or inefficient. Currently two contrasting methods are utilized, dry etching and wet etching, both of which are well known in the art. Dry etching is an extremely slow process. It involves placing a photo resist on the substrate to cover places not desired etched, placing in a gas chamber and applying a plasma with gases to eat away at the exposed silicon. With this method, rapid etching of a silicon crystal is not possible. One of the faster dry etch techniques is covered in U.S. Pat. No. 4,741,799 by Chen and Matthad. This method yields an etch rate of 1.6 microns per minute. At this rate with a typical wafer being about 2 millimeters, dry etch of a single substrate would take almost a day to complete.

The second process, wet etch is relatively quicker than dry etch. However, wet etching occurs in a preferential direction usually at an angle of about 107 degrees. It etches at a fixed angle along a crystal plane. That means that with a 1 millimeter via, the depth will not reach the other side of a wafer. Thus this technique though faster, utilize a large surface area for each via resulting in a loss of chip surface area for additional connection points similar to the problem with the current chips with side connectors.

Central processing units need high power to feed the integrated circuits populated on the package. Current silicon on silicon packaging schemes utilize wiring bonding to get signals off the silicon substrate. The wire bonding cannot be utilized for the high power needed. Large vias through the substrate will be reliable carriers of the power needed.. The high power problem has not been addressed in the silicon on silicon scheme.

It is therefore desirable to have a substrate design for a semiconductor chip package which provides the signal and power connections necessary for efficient processing. It is further desirable to provide a package with a via having a constant bore to maximize utilization of the surface area for increased density of connections to IC chips on a silicon substrate.

SUMMARY OF THE INVENTION

It is therefore one object of the present invention to provide an improved semiconductor device.

It is another object of the present invention to provide an improved semiconductor chip package.

It is yet another object of the present invention to provide a semiconductor chip package having a silicon substrate with connection vias running through it for attaching and interconnecting to electrical power and other electronic devices.

The foregoing objects are achieved as is now described. A package for integrated circuit chips is disclosed. The package contains a silicon substrate having a top surface and a bottom surface. The package also contains a first means for electrically connecting the integrated circuits to the substrate attached to the top surface of the substrate. A multilevel wiring is located at the top surface and is coupled to the first connecting means and serves as a communication link among a plurality of the first connecting means to enable multi-chip processing. A via containing means for coupling the multilevel wiring at the top surface to the bottom surface runs through the substrate from the bottom surface to the top surface. A second means is also present for connecting the coupling means at the bottom surface of the substrate with external components.

In the preferred embodiment, the package has an insulating material between the conductive means and the silicon surface area of the via which also serves to prevent barrier diffusion. Further connections to the IC chips and other components are accomplished with a controlled, collapsible chip connection and ball grid array on the surfaces.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 4A and 4B depict cross-sectional views of a silicon on silicon semiconductor chip package with through wafer interconnects and wiring levels in accordance with a preferred embodiment of the present invention.

DETAILED DESCRIPTION OF PREFERRED EMBODIMENT

Figure 2:
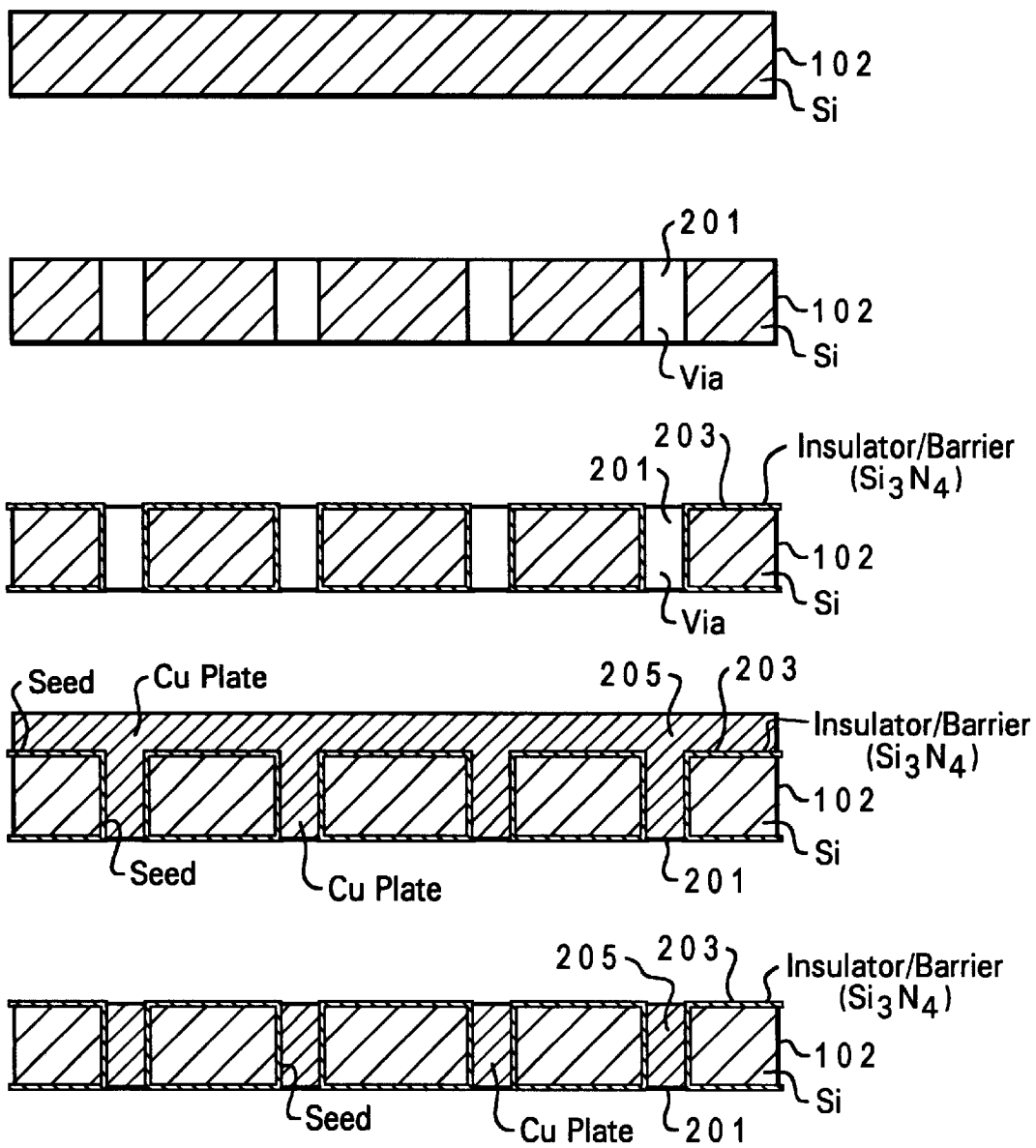
FIG. 2 depicts the steps involved in creating vias in a silicon substrate in accordance with the preferred embodiment of the present invention.

This invention describes a silicon package with vias formed through the wafer to achieve interconnection to other components. The invention further describes the methods utilized to create the vias in the silicon substrate. With reference now to the figures and in particular with reference to FIG. 2, the process of creating the silicon substrate of the preferred embodiment is depicted. In the preferred embodiment, the wafer is first patterned to allow for the vias to be made with particular sizes and placed in the desired locations and at predetermined separation distances to maximize the chip area.

A standard silicon substrate 102 is utilized in the invention. A plurality of vias 201 are created in silicon substrate 102. In the preferred embodiment, vias 201 are created in one of two ways. The first method utilizes mechanical drilling. The silicon wafer is first submerged in a liquid, preferably water and held down in place either mechanically or with a wax or other adhesive substance on the back to prevent it from moving around while the vias 201 are being created.

In the preferred embodiment, drill bits made of diamond are placed on a high speed drill connected to the arm of the mechanical drill press and are made to rotate at a speed in the order of 20 KRPM (kilo revolutions per minute). The bit is pressed into the silicon wafer and drills through the wafer to create vias within a period of time. Said time period ranges from the 0.1 through 20 seconds in the preferred embodiment but may take somewhat longer in different environmental situations. In the preferred embodiment, a large number of vias are created simultaneously by placing a large number of drill bits on the arm of the mechanical drill press which rotates each bit simultaneously when operated. The spacing between the drill bits is adjusted according to the manufacturers specifications. In one embodiment of the invention a first set of vias is drilled in the wafer followed by a second set and subsequent sets at different locations at predetermined distances away from the previous set or sets of vias. Those skilled in the art are familiar with the process of simultaneously drilling a plurality of vias and of multiple drilling sets as utilized in other applications. In the preferred embodiment, vias are made with 1 mm diameter and spaced 1 mm apart from each other to enable location of all pins in the back of the wafer. Typically, a wafer has between 3000 to 5000 pins in the back resulting in that number of vias being drilled in the preferred embodiment.

The second preferred embodiment involves ultrasonically milling the vias. The wafer is held down mechanically or with a wax or other adhesive substance. A slurry comprising of a grinding medium is placed on the surface of the wafer. Stainless steel fingers are then moved ultrasonically over the slurry in a vibrating manner. This forces the slurry into the silicon and created the vias. As with the drilling method, a plurality of vias are creates simultaneously utilizing in this embodiment a plurality of steel fingers moving against the slurry simultaneously. Those skilled in the art are also familiar with ultrasonic drilling as is utilized in other applications.

Returning now to FIG. 2, once the drilling process is completed the entire silicon substrate 102 and inner surface area of vias 201 are covered with a barrier 203 which insulates the conductive material (copper) and prevents it from diffusing into the silicon substrate. In the preferred embodiment, insulating barrier 203 is silicon nitride and is deposited utilizing chemical vapor deposition (CVD). This barrier protects the conductive material being later placed in vias 201 from reacting with the silicon which is highly reactive with other metals. It also serves to prevent the silicon from acting as a conducting material during operation of the semiconductor circuit. Following, a seed material is placed in the vias utilizing physical vapor deposition, a technique known in the art. In the preferred embodiment, copper is utilized as the seed material. Conventional electroplating is then utilized to cover the wafer and fill the vias with a metallic substance which serves as the conductive material. In the preferred embodiment, this material is copper 205. As in conventional electroplating, excess material is deposited on the surface of the wafer and is polished off utilizing chemical mechanical polishing (CMP).

Those skilled in the art are familiar with the processes involved in the preparation for and deposition of the conductive material after the vias have been created. It is understood that other methods of preparation and deposition exist and that all such methods are contemplated by this invention. Although drilling and ultrasonic milling methods have been described within the preferred embodiments of the invention, it is contemplated that the invention cover all methods of creating a via within EL silicon substrate with substantially equal bore and which permits large power inputs to be provided to the IC chips on the substrate.

After the vias have been created, standard dual damascene processing forms the multilevel wiring layers that connect with the through substrate vias. C4 and/or ball grid array bumps are finally deposited for connecting the IC chips.

In the preferred embodiment, the vias can transport large power inputs to the integrated circuits. Traditional wire bonding cannot handle the large currents expected to be needed for the package.

The vias are preferably arranged in a grid design or in alignment with outer lead on sides of a chip having peripheral bonding and can be electrically connected to the integrated circuit chips. Additionally, the vias can be filled completely with a conductive material or simply can be coated along their walls with a conductive material.

Figure 1:
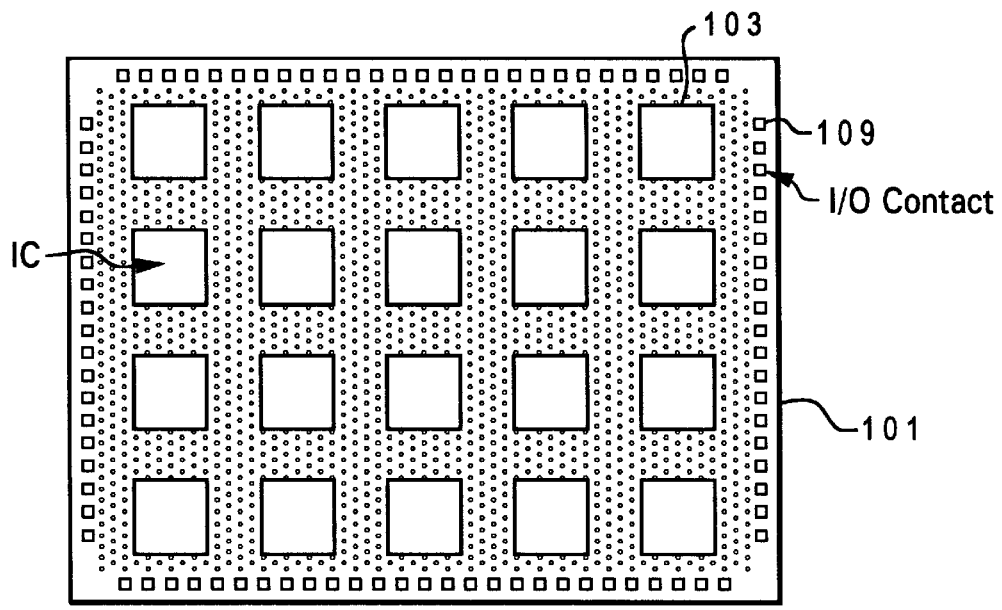
FIG. 1 illustrates a bottom plan view of a prior art silicon-on-silicon semiconductor chip package.
Figure 3:
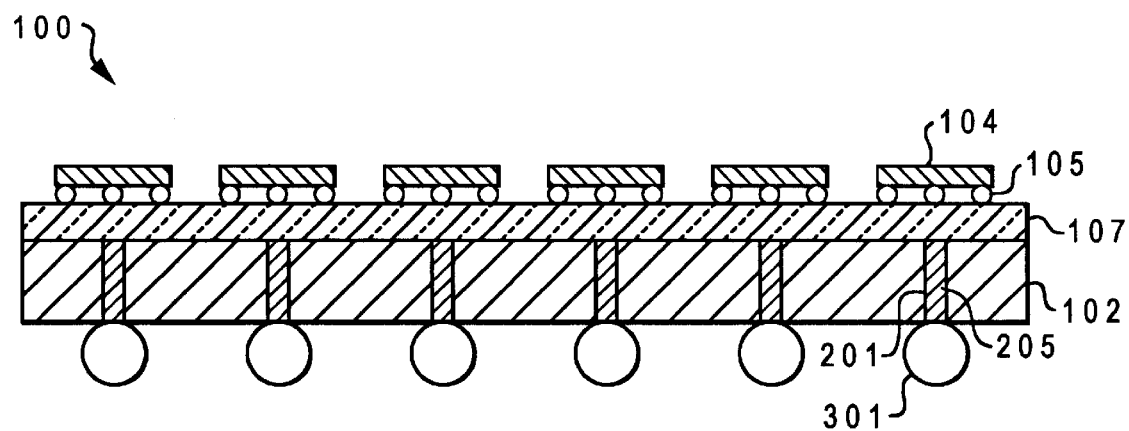
FIG. 3 depicts a cross sectional view of a silicon on silicon semiconductor chip package with through wafer interconnects in accordance with a preferred embodiment of the present invention.

Turning now to FIG. 3, there is illustrated a cross-sectional view of the completed semiconductor chip package 100. Chip package 100 comprises of silicon substrate 102 with through substrate vias 201 containing conductive material made of copper. Located at the top of silicon substrate 102 is multilevel wiring layers 107 which connect to C4 bond balls 105. C4 bond balls 105 act as the connecting points for the integrated circuit chips 104. Located at the bottom of -he chip package and coupled to the copper 205 are balls for a ball grid array bonding 301.

FIG. 4A and 4B illustrates two high level cross-sectional view a semiconductor chip package having a through wafer via to provide signal or power/ground in accordance with the present invention. Referring first to FIG. 4A, semiconductor chip package comprises a silicon substrate 102 upon which one or more of integrated circuit chip 104 are mounted. As will be appreciated by those skilled in the art, integrated circuit chip 104 comprises a silicon die within which 1 million or more components may be fabricated. To facilitate input and output of data and to supply power to integrated circuit chip 104, the lower (active) surface of integrated circuit chip 104 has numerous closely spaced chip connections (not shown) at locations corresponding to bond pads which are C4 bond balls 105 or other conductive metallizations on the top surface of silicon substrate 102. Chip connections typically have a size and spacing or "pitch" of approximately 5 mil (0.005 in.) diameters at 10 mil (0.010 in.) centers. However, the size and pitch of chip connections could be increased, decreased, or irregular without detriment to the present invention. Chip connections comprise non-eutectic solder microballs which form a controlled, collapsible chip connection (C4); however, those skilled in the art will appreciate that, in the alternative, chip connections can be formed by wire bond, tab attach, or other conventional attachment means. Moreover, although not illustrated within FIG. 4A, those skilled in the art will appreciate that integrated circuit chip 104 may be encapsulated by a thermoplastic or by a preformed aluminum, plastic, or ceramic cap to provide mechanical protection and/or thermal performance enhancement to integrated circuit chip 104 and chip connections.

Still referring to FIG. 4A, silicon substrate 102 comprises of silicon. Silicon substrate 102 contains a multilevel wiring layer 107 which provides on-device interconnection to integrated circuit chip 104. In accordance with the present invention, and as described in detail above, silicon substrate 102 includes a plurality of through substrate vias 201 made of copper, which can each be configured either as an I/O connector for integrated circuit chip's 104 signaling/communication or as a power supply for the integrated circuit chip 104. In the depicted embodiment, each via 201 is coupled to a contact 401 at the bottom surface of silicon substrate 102. Contact 401 may be a grid array made of ceramic or copper based material.

Referring now to FIG. 4B, a closer cross sectional view is presented of a single via in accordance with the preferred embodiment. All the components of FIG. 4B which are similar to FIGS. 4A have been previously described and will not be repeated in this description of FIG. 4B. In FIG. 4B, seed material 403 described above and utilized in the manufacturing process is depicted as a layer between via 201 and insulating barrier 203. Further, the presence of insulating material 403 on the bottom surface of the substrate is shown. Insulating material 403 is silicon oxide in the preferred embodiment.

As has been described, the present invention provides an improved integrated circuit chip package that includes one or more electrical contacts configurable as either signal or power/ground on a production-sized substrate. Although the present invention has been described and illustrated with reference to specific embodiments, it is not intended that the invention be limited to the illustrated embodiments. For example, the present invention is not limited to embodiments constructed utilizing the materials specifically described and illustrated herein. In addition, the present invention is applicable to numerous packaging types, including single chip modules (SCMs), multi-chip modules (MCMs), ball grid array (BGA), pin grid array (PGA), plastic ball grid array (PBGA), enhanced quad flat package (QFP) with predefined power and ground structures, and the like.

While the invention has been particularly shown and described with reference to a preferred embodiment, it will be understood by those skilled in the art that various changes in form and detail may be made therein without departing from the spirit and scope of the invention.

What is claimed is:

1. A carrier for integrated circuit chips comprising:
    a semiconductor material having a first planar surface and a second planar surface;
    a via extending directly through said semiconductor material from said first planar surface to said second planar surface;
    a conductive material extending through said via from said first planar surface to said second planar surface for passing signals along the vias extending through the semiconductor material;
    an insulation barrier between said conductive material and an inner surface area of said via to insulate said conductive material from said semiconductor material;
    a multilevel wiring located at said first planar surface and coupled to said conductive material, wherein said multilevel wiring provides a communication link between multiple integrated circuits on said first planar surface;
    a first connecting means for electrically coupling integrated circuits to said multilevel wiring; and
    a second connecting means extending beyond said second planar surface for connecting said conductive material at said second planar surface with external components.

2. The carrier of claim 1, wherein said first connecting means comprises a controlled, collapsible chip connection and a ball grid array.

3. The carrier of claim 1, wherein said conductive material includes a copper-based material.

4. The carrier of claim 1, wherein said semiconductor material comprises silicon.

5. The carrier of claim 4, wherein said insulation barrier comprises a silicon nitrate based material.

6. The carrier of claim 1, wherein said conductive material enables transmission of electrical signals and power directly through said carrier to an integrated circuit chip attached to said first planar surface, and further wherein said conductive material supports large power inputs to said integrated circuit chip.

7. The carrier of claim 1, wherein said second connecting means is an extension of said conductive material.

8. The carrier of claim 1, wherein said via has a substantially even bore throughout said substrate from said first planar surface to said second planar surface.

9. The carrier of claim 1, containing a plurality of vias wherein said plurality of vias are distributed within said semiconductor material in a pattern wherein a first via is separated from a second via by a distance that substantially maximizes a number of vias provided in a surface area of said semiconductor material.

10. An integrated circuit chip package, comprising:
    an integrated circuit chip;
    a semiconductor carrier for supporting said integrated circuit chip;
    a via having substantially even bore through said semiconductor carrier from a first planar surface to a second planar surface;

a dedicated conductor extending through said via for passing signals and power along the via extending through the semiconductor carrier to said integrated circuit chip;

an insulation barrier between said dedicated conductor and semiconductor material that lines an inner surface area of said via;

a multilevel wiring located at said first planar surface and coupled to said dedicated conductor, wherein said multilevel wiring provides a communication link between multiple integrated circuits on said first planar surface; and a configurable contact coupling said integrated circuit chip to said multilevel wiring.

11. The integrated circuit chip package of claim 10, wherein said dedicated conductor comprises a copper-based material.

12. The integrated circuit chip package of claim 10, wherein said dedicated conductor has a connector extending below said bottom surface, and further wherein said connector is adapted to provide connection to an external component.

13. The integrated circuit chip package of claim 10, wherein said configurable contact comprises a controlled, collapsible chip connection and a ball grid array.

14. The integrated circuit chip package of claim 10, wherein said insulation barrier comprises a silicon nitrate based material.

15. The integrated circuit chip package of claim 10, further comprising a plurality of vias wherein said plurality of vias are distributed throughout said semiconductor carrier with a first via separated from a second via by a distance that substantially maximizes a number of vias provided in a surface area of said semiconductor carrier.

16. The integrated circuit chip package of claim 10, wherein said semiconductor carrier comprises silicon.

* * * * *

UNITED STATES PATENT AND TRADEMARK OFFICE
CERTIFICATE OF CORRECTION

PATENT NO. : 6,268,660 B1
DATED : July 31, 2001
INVENTOR(S) : Sang Hoo Dhong et al.

It is certified that error appears in the above-identified patent and that said Letters Patent is hereby corrected as shown below:

<u>Column 6,</u>
Line 66, please change "-he" to -- the --.

Signed and Sealed this

Ninth Day of April, 2002

*Attest:*

JAMES E. ROGAN
*Attesting Officer*     *Director of the United States Patent and Trademark Office*